US007016659B1

(12) United States Patent
Dorrough et al.

(10) Patent No.: US 7,016,659 B1
(45) Date of Patent: Mar. 21, 2006

(54) AMPLITUDE MODULATION WITH TIME- AND SPECTRUM-SHARED SIDEBANDS

(75) Inventors: Michael L. Dorrough, 5221 Collier Pl., Woodland Hills, CA (US) 91364; Dennis Robert Lee, Van Nuys, CA (US); Alfred Edward Parker, Hicksville, NY (US); Richard Williamson Burden, Winnetka, CA (US)

(73) Assignee: Michael L. Dorrough, Woodland Hills, CA (US)

( * ) Notice: Subject to any disclaimer, the term of this patent is extended or adjusted under 35 U.S.C. 154(b) by 515 days.

(21) Appl. No.: 10/458,835

(22) Filed: Jun. 12, 2003

(51) Int. Cl.
*H04B 1/02* (2006.01)

(52) U.S. Cl. ............... 455/108; 455/203; 455/204; 375/300; 375/301; 375/320; 375/321; 332/149; 332/170

(58) Field of Classification Search ............... 455/47, 455/102, 104, 108, 109, 203, 204; 375/268, 375/270, 300, 301, 320, 321; 332/149, 170
See application file for complete search history.

(56) References Cited

U.S. PATENT DOCUMENTS

| 4,569,073 A | * | 2/1986 | Kahn | ............... | 381/16 |
| 4,850,020 A | * | 7/1989 | Kahn | ............... | 381/16 |
| 5,097,218 A | * | 3/1992 | Cooper | ............... | 327/237 |

* cited by examiner

Primary Examiner—Duc Nguyen
Assistant Examiner—Tuan H. Nguyen
(74) Attorney, Agent, or Firm—J. E. McTaggart

(57) ABSTRACT

In an AM system directed to commercial broadcasting, a pure unmodulated (CW) carrier signal and two sideband signals are generated and processed separately as three independent signals that are summed as output of a final linear mixer. The sideband signals are derived independently utilizing audio spectrum-sharing based on complementary comb filtering, quadrature phase-shifting at both audio and carrier sideband frequencies, and exclusive alternate toggling at a designated switching rate between the two sidebands so that at any instant in time only one of the two sidebands is present along with the continuous carrier. The overall performance provides the capability of advantageous modulation beyond the conventional 100% modulation limit.

4 Claims, 2 Drawing Sheets

AMPLITUDE MODULATION WITH TIME- AND SPECTRUM-SHARED SIDEBANDS

FIELD OF THE INVENTION

The present invention relates to the field of radio broadcasting and communications, and more particularly it relates to an advanced method of amplitude modulation to increase the energy level of AM transmitters while maintaining compliance with standard broadcast regulations.

BACKGROUND OF THE INVENTION

In regular double sideband amplitude modulation broadcast and communication as it has been practiced for nearly a century, a generated carrier frequency is modulated by varying the carrier's amplitude (voltage and current) in accordance with an audio frequency modulating signal.

The theory of amplitude modulation is well known. In a pure unmodulated sine wave carrier all of the power or energy is at the carrier frequency. Apart from circuit losses, the applied DC input power is radiated at that single carrier frequency. When amplitude modulation is applied, the resulting momentary departures from a pure sine waveform require additional power input, and this additional power becomes radiated as sidebands that are offset in frequency above and below the carrier frequency by an amount equal to the frequency of the modulating signal. A 1 mHz carrier that is amplitude modulated by a steady 1 kHz sine wave tone produces unmodulated sine wave sideband signals at 0.999 mHz and 1.001 mHz. To accommodate these sideband signals, channels of designated bandwidth, e.g. 10 kHz, are allocated in the broadcast band under FCC licence to AM broadcast stations, and each station is required to operate within regulations regarding adjacent channel interference.

Up to 100% modulation, any change of amplitude or frequency of the modulating tone will result in a corresponding change in the sidebands with regard to amplitude or frequency offset from the carrier, which remains constant.

At 100% modulation, with a single steady sine wave modulating tone, the transmitted envelope, as observed on an oscilloscope, is driven to twice its unmodulated level at the positive audio/envelope peaks and to zero at the negative audio peaks (envelope troughs). The total energy in the band/can be resolved mathematically into a pure carrier at the center frequency remaining at the original unmodulated level, and the two equal sidebands, each −6 dB relative to the carrier i.e half amplitude and thus one quarter power.

Thus modulating 100% increases the total power to 150%, i.e. 50% over the unmodulated carrier power: the total in-channel transmitted power is 1.5 times the unmodulated carrier power, while the total power in the sidebands is one half the unmodulated carrier power, and the power in each sideband is one quarter the unmodulated carrier power (−6 db). The foregoing conditions are confirmed when observed on a spectrum analyzer: the "constant amplitude" carrier appears at center frequency flanked by the upper and lower sidebands at half the amplitude of the carrier (−6 dB), and as the % modulation is varied, the amplitude of the sidebands vary accordingly while the carrier remains constant. Accordingly all of the desired communication information imparted by amplitude modulation resides in the sidebands and not in the constant carrier, which plays the role of a fixed "bias" and is utilized in the receiver as a frequency and amplitude reference for functions that are independent of audio modulation, such as signal strength and/or tuning indication, AGC (automatic gain control) and/or AFC (automatic frequency control).

If the modulation is increased beyond 100% in the typical two-quadrant modulator used in AM transmitters, the envelope peaks increase accordingly; however, at the troughs, the sine wave envelope shape is abruptly disrupted and its slope is interrupted to become a straight horizontal line, i.e. the "zero" line. This effect, commonly described as "pinch off", produces at the "corners" at the start and finish points in time of the straight zero line, a spectrum of spurious emissions that typically 'spatter' beyond the band limits and potentially interfere with adjacent channels in violation of broadcast regulations. Therefore broadcast stations try to not exceed 100% negative modulation to avoid interference due to this "pinch-off" effect, while at the same time competitive forces dictate that the available carrier and modulating power be deployed as effectively and efficiently as possible to maximize listener coverage with a strong, clear and energetic-sounding signal. In recognition that the interference problem originates at "pinch-off" at the envelope troughs and not at the envelope peaks, regulations have been relaxed to allow some amount of "upward" modulation, e.g. to a level corresponding to 125% modulation as long as "pinch-off" and resultant out-of-band "splatter" interference are avoided.

Consequently, special audio processing using some form unbalanced or asymmetrical ALC (automatic level control), clamping, clipping, unbalanced or asymmetrical compression and/or expansion techniques have been utilized to accomplish some form of "upward modulation" while avoiding "pinch-off" interference, however such approaches typically introduce considerable non-linearity and distortion in the audio as a tradeoff for increased radiated sideband power.

Therefore there is an unfulfilled need for a modulation system that can increase the audible clarity and loudness of an AM transmitter by realizing the potential advantage of upward modulation beyond 100% within the transmitter's power capabilities while avoiding unwanted spurious interference from "pinch-off" effect and also avoiding distortion in the received audio due to non-linearity, particularly asymmetry, in the modulating process.

DISCUSSION OF KNOWN ART

U.S. Pat. Nos. 4,499,339 and 4,617,536 to Richard disclose a method and apparatus that clamps the modulating signal at a reference level to prevent overmodulation of a carrier. The apparatus is suggested for use in conjunction with hearing aids, and includes a circuit option that can compress the dynamic range to smaller than normal.

U.S. Pat. No. 4,225,822 to Kariatsumari discloses an amplitude modulation circuit for a transmitter that utilizes an automatic level control (ALC) circuit to avoid overmodulation. The ALC circuit includes a high-pass filter in its negative feedback loop that, while maintaining a flat audio frequency response at all time and while maintaining a sufficiently high mean modulation degree when the main spectrum components are in an intermediate range of the audio frequency band, it acts to restrict the upper limit of modulation degree sufficiently to avoid spurious overmodulation emissions whenever the main spectrum components of the audio signal are in the high frequency region of the audio spectrum.

U.S. Pat. No. 4,569,073 to Kahn discloses "an AM transmission system, which is compatible with conventional AM receivers", wherein "the transmitted signal comprises a carrier and two unequal amplitude sidebands".

U.S. Pat. No. 4,850,020 to Kahn discloses audio signal processing which operates in conjunction with the foregoing '073 patent to provide asymmetrical sideband AM stereo transmission, which, for reception, requires decoding by a special ISB (independent sideband) AM stereo receiver.

OBJECTS OF THE INVENTION

It is a primary object of the present invention to provide an amplitude modulating system that enables a substantial increase in the peak level of the sidebands and radiated sideband power.

It is a further object to provide an amplitude modulating system that enables an AM transmitter to operate at increased amplitudes that sound appreciably louder to a listener receiving the signal on a standard receiver than the same program material modulating the transmitter in the conventional manner.

It a further object that the invention obtain the foregoing described benefits without utilizing forms of audio processing that introduce distortion due to non-linearity, asymmetry, compression, expansion, ALC and the like.

SUMMARY OF THE INVENTION

The forgoing objects have been accomplished in the present invention by an amplitude modulation system wherein the carrier and two sidebands are generated independently. A pure unmodulated (CW) carrier signal is provided in a final mix with two sidebands that are derived utilizing audio spectrum-sharing based on complementary comb filtering, quadrature phase-shifting at both audio and carrier sideband frequencies, and exclusive alternate toggling at a designated switching rate between the two sidebands so that at any instant in time only one of the two sidebands is present. The overall performance provides modulation beyond the conventional 100% modulation limit on positive envelope peaks while avoiding conventional negative overmodulation out-of-band "splatter" interference.

DETAILED DESCRIPTION

Figure 1:
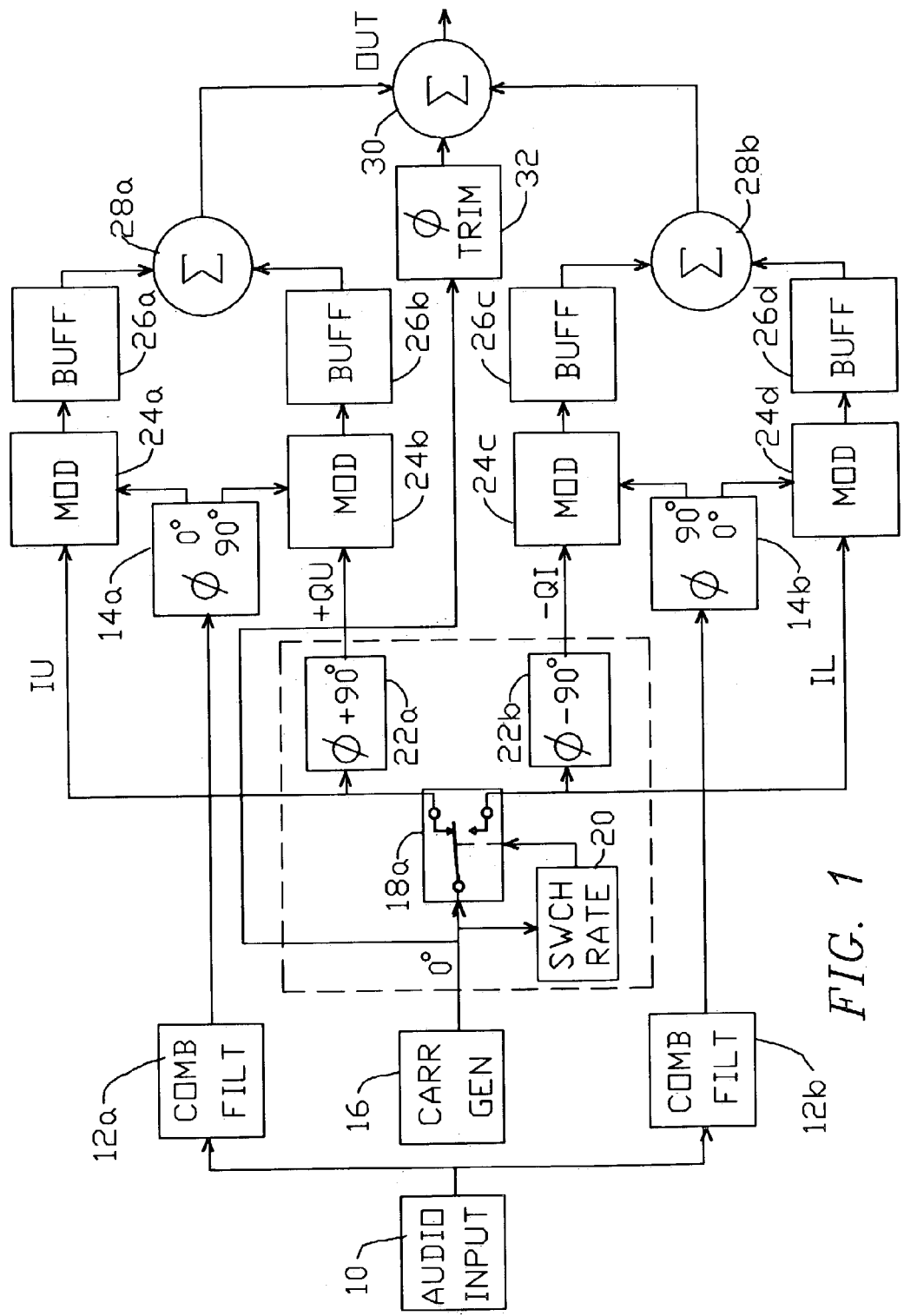
FIG. 1 is a functional block diagram of a first embodiment of the amplitude modulating system of the present invention.

In the functional block diagram, FIG. 1, of a first embodiment of an amplitude modulation system representing a preferred embodiment of the present invention, modulating audio from a source of audio input 10 is divided into two channels, one for each carrier sideband, First the audio input 10 is applied to a pair of comb filters 12a and 12b which are designed and set up to complement each other with regard to frequency response within the audio spectrum, the amplitude response of each being the mirror image of that of the other. The resolution of these two comb filters may range from a fraction of an octave to several octaves, while remaining complemetary. The comb filter parameters may be varied to optimize overall signal performance.

The two audio signals are each processed by an identical pair of Hilbert type all-pass filters 14a and 14b, each of which provides an audio output with an in-phase reference signal (indicated in FIG. 1 as "0") and a quadrature audio output, (indicated as in FIG. 1 as "90") which is shifted in phase +90 degrees relative to the reference signal across a designated audio spectrum. Each of these four signals is connected as a corresponding audio input to one of four identical balanced four-quadrant modulators 24a, 24b, 24c and 24d.

Within the dashed outline near the center of FIG. 1, a high frequency SPDT (single-pole double-throw) electronic switch 18a receives as (optional) sync input the carrier from carrier generator 16, and provides two switched outputs:

(1) carrier IU from the upper-switched terminal of electronic switch 18a provides the in-phase (reference) carrier signal to the carrier input of modulator 24a. Carrier IU also feeds +90 degree phase shift network 22a, providing the quadrature carrier input to modulator 24b.

(2) carrier IL from the lower-switched terminal of electronic switch 18a provides the in-phase (reference) carrier signal to the carrier input of modulator 24d. Carrier IL also feeds −90 degree phase shift network 22b providing the quadrature carrier input to modulator 24c.

Switch rate generator 20 provides a square wave switching control signal to toggle electronic switch 18a at a designated switching rate.

Thus the carrier is alternately switched by switch 18a so as to toggle symmetrically between the two pairs of modulators: upper sideband modulators 24a/b and the lower sideband modulators 24c/d. Each pair of modulators, both upper and lower sideband, receive audio inputs that are in quadrature respectively from the Hilbert all-pass filters 14a and 14b.

In the pole-up state of switch 18a shown in FIG. 1, the upper sideband modulators 24a and 24b are active while lower sideband modulators 24c and 24d remain quiescent, thus there is no lower sideband present; conversely, during the pole-down state in the opposite half of the switching cycle, the lower sideband modulators 24c and 24d are active while the upper sideband modulators 24a and 24b remain quiescent, thus there is no upper sideband present.

The outputs of modulators 24a and 24b are applied via buffers 26a and 26b to inputs of summing amplifier 28a, the output of which constitutes the upper sideband components.

The outputs of modulators 24c and 24d are applied via buffers 26c and 26d to the inputs of summing amplifier 28b, the output of which constitutes the lower sideband components.

Summing amplifiers 28a and 28b feed the respective upper and lower sidebands into summing amplifier 30. Also applied to the input of summing amplifier 30 is the reference carrier, aligned through phase adjust circuit 32 so that the carrier is properly in-phase with the sidebands. Thus the output of summing amplifier 30 contains the carrier plus the upper and lower sideband components.

Figure 2:
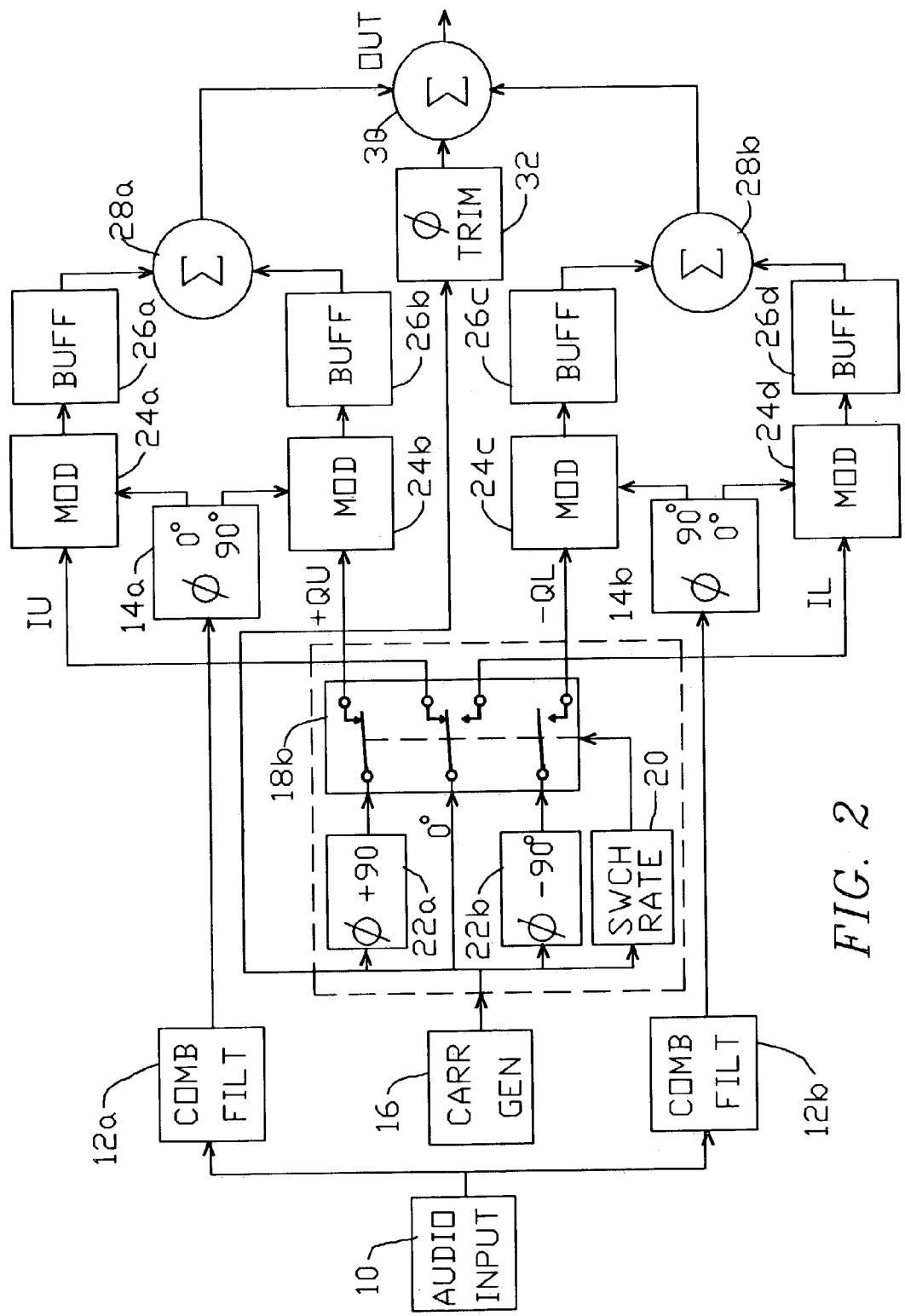
FIG. 2 is a functional block diagram of a second embodiment of the amplitude modulating system of the present invention.

FIG. 2 is a functional block diagram of a second embodiment of the amplitude modulating system of the present invention. The difference from FIG. 1 is within the dashed outline in FIG. 1 and FIG. 2. The operation of the circuit blocks outside the dashed outline in FIG. 2 is the same as described above in connection with the first embodiment shown in FIG. 1, and the overall result is equivalent. As seen within the dashed outline, the difference is essentially a reversal of sequence: in FIG. 1 the carrier is first switched in SPDT electronic switch 18a then split into in-phase and quadrature carriers in blocks 22a and 22b for their respective modulators, while in FIG. 2 the quadrature phase-shift is performed ahead of the electronic switch, requiring a 3PDT electronic switch 18b.

Within the dashed outline in FIG. 2, the in-phase carrier from generator 16 is applied directly to the center pole of the 3PDT electronic switch 18b, as well as to the inputs of the +90 degree carrier phase shifter circuit 22a and the −90 degree carrier phase shift circuit 22b.

In the poles-up state of electronic switch 18b shown, the in-phase carrier is applied by the middle switch pole as signal IU to upper sideband modulator 24a, and the +90 degree shifted carrier is applied by the upper switch pole as signal +QU to the other upper sideband modulator 24b, while no signal is applied to the carrier inputs of the lower sideband modulators 24c and 24d, thus there is no lower sideband present for the duration of this switch state.

Conversely, in the opposite (poles-down) state of switch 18b, the in-phase carrier is applied by the middle switch pole as signal IL to lower sideband modulator 24d, and the −90 degree shifted carrier is applied by the lower switch pole as signal −QL to the other lower sideband modulator 24c, while no signal is applied to the carrier inputs of the upper sideband modulators 24a and 24b, thus there is no upper sideband present for the duration of this switch state.

In design layout, the circuit blocks shown within the dashed outline in FIG. 1 or in FIG. 2 are preferably grouped together in a single shielded module.

In both FIG. 1 and FIG. 2, which are equivalent with regard to overall operation, the modulating process can be considered to alternate symmetrically between the upper and the lower sideband at the designated switching rate, so that at any instant during either half of the switch cycle the system can be regarded as single sideband, enabling increased peak modulation capability to a higher limit than with conventional amplitude modulation.

The designated switching rate is typically selected to be higher than the carrier frequency, e.g. twice the carrier frequency, and is preferably synchronized to the carrier, therefore the switch rate generator 20 is shown receiving the carrier as a synchronizing input; however the invention can be practiced with rate generator 20 operating at other designated switching rates above or below the carrier frequency, with or without carrier sync.

With the further enhancement provided by the complementary configuration of the audio comb filters 12a and 12b and the quadrature manner of their application to the modulators, the overall potential benefit is an increase in effective radiated power approaching 6 dB over the conventional 100% AM, thus providing the capability of a substantial increase in sideband amplitude.

It is to be understood that FIG. 1 and FIG. 2, as functional block diagrams, are somewhat simplified for purposes of facilitating the reader's grasp of the subject matter and basic principles involved, and that actual implementations therefrom involve detailed design procedures and choices of equivalent circuit and wiring variations that are well known in the electronic arts.

The invention may be embodied and practiced in other specific forms without departing from the spirit and essential characteristics thereof. The present embodiments are therefore to be considered in all respects as illustrative and not restrictive, the scope of the invention being indicated by the appended claims rather than by the foregoing description; and all variations, substitutions and changes which come within the meaning and range of equivalency of the claims are therefore intended to be embraced therein.

What is claimed is:

1. An amplitude modulation system comprising:
   a carrier generator providing as output an unmodulated carrier signal at a designated carrier frequency;
   electronic carrier switching and phase-shifting circuitry, receiving as input the unmodulated carrier signal at reference phase, made and arranged to provide two pairs of switched carrier signals: the first pair comprising a first switched carrier signal at reference phase and a second switched carrier signal having phase shifted +90 degrees nominal relative to the reference phase, and a second pair comprising a third switched carrier signal having phase shifted −90 degrees nominal relative to the reference phase and a fourth switched carrier signal at reference phase, and to sequentially select each of the two pairs alternately at a designated switching rate in a manner to (a) hold the first pair on while holding the second pair off and (b) hold the first pair off while holding the second pair on;
   an audio input source providing an audio source signal containing desired modulation information;
   a first sideband generating system comprising:
     a first audio comb filter receiving as input the audio modulating signal and providing a spectrally selected output signal;
     a first audio all-pass phase-shifting circuit, receiving as input the output signal of the first comb filter, made and arranged to provide as output a "0 degree" audio output and a "90 degree" audio output shifted in phase approximately 90 degrees relative to the "0 degree" audio output throughout a designated audio spectrum;
     a first balanced four-quadrant modulator circuit, receiving as a first input the "0 degree" audio output of the first audio all-pass phase-shifting circuit and receiving as a second input the first switched carrier signal, made and arranged to provide as output, via a first buffer circuit, a first sideband signal component;
     a second balanced four-quadrant modulator circuit receiving as a first input the "90 degree" output of the first audio all-pass phase-shifting circuit and receiving as a second input the second switched carrier signal, made and arranged to provide as output, via a second buffer circuit, a second sideband component;
     a first summing circuit, receiving as inputs the first sideband component from the first buffer circuit and the second sideband component from the second buffer circuit, made and arranged to sum the two inputs and provide as output a first summed sideband signal; and
   a second sideband generating system comprising:
     a second comb filter receiving as input the audio modulating signal, made and arranged to provide as output a second spectrally selected audio signal that is complementary to the first spectrally selected audio signal with regard to spectral segments of maximum and minimum response;
     a second all-pass audio phase-shifting circuit, receiving as input the output signal of the second comb filter, made and arranged to provide as output a "0 degree" audio output and a "90 degree" audio output, phase-shifted approximately 90 degrees relative to the "0 degree" audio output throughout a designated audio spectrum;
     a third balanced four-quadrant modulator circuit, receiving as a first input the "90 degree" audio output of the second all-pass phase-shifting circuit and receiving as a second input the third switched carrier signal, made and arranged to provide as output, via a third buffer circuit, a third sideband component;

a fourth balanced four-quadrant modulator circuit receiving as a first input the "o degree" audio output of the second all-pass phase-shifting circuit and receiving as a second input the fourth switched carrier signal, made and arranged to provide as output, via a third buffer circuit, a fourth sideband component;

a second summing circuit, receiving as inputs the third sideband component from the third buffer circuit and the fourth sideband component from the fourth buffer circuit, made and arranged to sum the two inputs and provide as output a second summed sideband signal;

a phase refinement circuit receiving as input the unmodulated carrier signal, made and arranged to enable phase adjustment over a predetermined range for proper phase relationship with the sidebands, and to thus provide as output a phase-refined unmodulated carrier signal; and a third summing circuit, receiving as a first input the first summed sideband signal, receiving as a second input the second sideband signal and receiving as a third input the phase-refined unmodulated carrier signal, made and arranged to sum and combine the three input signals as output of the amplitude modulation system including the carrier signal and two sidebands.

2. The amplitude modulation system as in claim 1, wherein said electronic carrier phasing and switching circuitry comprises:

an electronic SPDT switch receiving as input the unmodulated carrier signal from the carrier generator: and providing as output the first switched carrier signal and the fourth switched carrier signal;

a first phase shifting circuit receiving as input the first switched carrier from the SPDT switch, made and arranged to introduce a +90 degree nominal phase shift and to thus provide as output the second switched carrier signal; and a second phase shifting circuit receiving as input the fourth switched carrier signal from the SPDT switch, made and arranged to introduce a −90 degree nominal phase shift and to thus provide as output the third switched carrier signal.

3. The amplitude modulation system as in claim 1, wherein said electronic carrier phasing and switching circuitry comprises:

a first phase shifting circuit receiving as input the unmodulated carrier signal at reference phase from the carrier generator, made and arranged to provide as output a +90 degree nominal phase-shifted carrier signal;

a second phase shifting circuit receiving as input the unmodulated carrier signal at reference phase from the carrier generator, made and arranged to provide as output a −90 degree nominal phase-shifted carrier signal; and an electronic 3PDT switch receiving as a first input applied to a first pole the +90 degree nominal phase-shifted carrier signal from said first phase shifting circuit, as a second input applied to second pole the unmodulated carrier signal at reference phase from the carrier generator, and as a third input the −90 degree nominal phase-shifted carrier signal from said second phase shifting circuit, the 3PDT switch being made and arranged to provide as output four signals: the first, second, third and fourth switched carrier signals.

4. A method of providing an amplitude modulated signal comprising the steps of:

acquiring an audio source signal;

generating an unmodulated carrier signal at a designated carrier frequency;

switching the unmodulated carrier signal at a predetermined rate frequency in a manner to alternately generate a first switched carrier signal and a second switched carrier, toggled there between symmetrically;

providing a first sideband modulating system having a first balanced four-quadrant modulator receiving as signal input the first switched carrier and a second balanced four-quadrant modulator receiving as signal input the first switched carrier phase-shifted by +90 degrees;

providing in the first sideband modulating system a comb filter receiving the audio source signal as input and providing as output a first comb-filtered audio signal;

applying the first comb-filtered audio signal at 0 degrees phase as modulating input to the first modulator;

shifting phase of the first comb-filtered audio signal by 90 degrees to provide a first quadrature comb-filtered audio signal;

applying the first quadrature comb-filtered audio signal as modulating input to the second modulator;

applying outputs from the first and second modulators via respective buffers to a first summing circuit;

providing a second sideband modulating system having a third balanced four-quadrant modulator receiving as signal input the first switched carrier shifted in phase by −90 degrees and a fourth balanced four-quadrant modulator receiving as signal input the first switched carrier;

providing in the second sideband modulating system a second comb filter, complementary in frequency response to the first comb filter, receiving the audio source signal as input and providing as output a second comb-filtered audio signal;

applying the second comb-filtered audio signal at 0 degrees phase as modulating input to the fourth modulator;

shifting phase of the second comb-filtered audio signal by 90 degrees to provide a second quadrature comb-filtered audio signal;

applying the second quadrature comb-filtered audio signal as modulating input to the third modulator;

applying outputs from the first and second modulators via respective buffers to a first summing circuit applying outputs from the third and fourth modulators via respective buffers as inputs to a second summing circuit;

applying outputs of the first and second summing circuit as first and second inputs to a third summing circuit;

applying the unmodulated carrier via a phase-refining circuit as a third input to the third summing circuit; and obtaining and deploying an amplitude modulated signal as output of the third summing circuit.

* * * * *